(12) United States Patent
Shanmugam et al.

(10) Patent No.: US 12,074,077 B2
(45) Date of Patent: Aug. 27, 2024

(54) FLEXIBLE PACKAGE ARCHITECTURE CONCEPT IN FANOUT

(71) Applicant: Apple Inc., Cupertino, CA (US)

(72) Inventors: Karthik Shanmugam, Singapore (SG); Flynn P. Carson, Redwood City, CA (US); Jun Zhai, Cupertino, CA (US); Raymundo M. Camenforte, San Jose, CA (US); Menglu Li, San Jose, CA (US)

(73) Assignee: Apple Inc., Cupertino, CA (US)

( * ) Notice: Subject to any disclaimer, the term of this patent is extended or adjusted under 35 U.S.C. 154(b) by 255 days.

(21) Appl. No.: 16/952,567

(22) Filed: Nov. 19, 2020

(65) Prior Publication Data

US 2022/0157680 A1 May 19, 2022

(51) Int. Cl.
*H01L 23/31* (2006.01)
*H01L 21/48* (2006.01)
(Continued)

(52) U.S. Cl.
CPC ...... *H01L 23/3121* (2013.01); *H01L 21/4857* (2013.01); *H01L 21/568* (2013.01); *H01L 23/31* (2013.01); *H01L 23/3157* (2013.01); *H01L 23/49816* (2013.01); *H01L 23/4985* (2013.01); *H01L 23/5385* (2013.01);
(Continued)

(58) Field of Classification Search
CPC . H01L 25/0655; H01L 25/072; H01L 25/105; H01L 25/115; H01L 23/31; H01L 23/3157; H01L 23/49827; H01L 23/49838; H01L 23/4985; H01L 23/5384; H01L 23/5385; H01L 23/5386; H01L 23/5387; H01L 23/5389; H01L 2224/24137; H01L 2224/02379; H01L 2924/18162; H01L 23/481; H01L 2225/06548; H05K 1/028; H05K 1/0278; H05K 2201/055; H05K 2201/056
See application file for complete search history.

(56) References Cited

U.S. PATENT DOCUMENTS 8,168,458 B2 5/2012 Do et al.
8,404,977 B2 * 3/2013 Fjelstad ................. H05K 1/189
174/254

(Continued)

FOREIGN PATENT DOCUMENTS

KR 2016-0063237 A 6/2016
KR 20170029921 A * 3/2017
TW 201351596 A 12/2013

OTHER PUBLICATIONS

Machine English translation of KR 10-2017-0029921 (Year: 2017).*

(Continued)

*Primary Examiner* — Yu Chen
(74) *Attorney, Agent, or Firm* — Aikin & Gallant, LLP

(57) ABSTRACT

Flexible packages and electronic devices with integrated flexible packages are described. In an embodiment, a flexibly package includes a first die and a second die encapsulated in a molding compound layer. A compliant redistribution layer (RDL) spans the molding compound layer and both dies, and includes electrical routing formed directly on landing pads of the dies. A notch is formed in the molding compound layer between the dies to facilitate flexure of the compliant RDL.

12 Claims, 8 Drawing Sheets

(51) Int. Cl.
  H01L 21/56    (2006.01)
  H01L 23/00    (2006.01)
  H01L 23/498   (2006.01)
  H01L 23/538   (2006.01)
  H01L 25/065   (2023.01)
  H01L 25/10    (2006.01)
  H05K 1/02     (2006.01)
  H01L 23/48    (2006.01)

(52) U.S. Cl.
  CPC ...... *H01L 23/5386* (2013.01); *H01L 23/5387* (2013.01); *H01L 24/24* (2013.01); *H01L 25/0655* (2013.01); *H01L 25/105* (2013.01); *H05K 1/0278* (2013.01); *H01L 23/481* (2013.01); *H01L 23/5384* (2013.01); *H01L 2224/24137* (2013.01); *H01L 2225/06548* (2013.01); *H01L 2924/18162* (2013.01)

(56) References Cited

U.S. PATENT DOCUMENTS

| | | | |
|---|---|---|---|
| 9,446,941 | B2 | 9/2016 | Jiang et al. |
| 9,633,950 | B1* | 4/2017 | We .................. H01L 21/565 |
| 9,633,977 | B1* | 4/2017 | We .................. H01L 23/5387 |
| 9,704,824 | B2 | 7/2017 | Lin et al. |
| 9,881,850 | B2 | 1/2018 | Yu et al. |
| 10,396,038 | B2 | 8/2019 | Cheah et al. |
| 2001/0006252 | A1* | 7/2001 | Kim .................. H01L 25/0657 257/688 |
| 2010/0301474 | A1 | 12/2010 | Yang |
| 2012/0086003 | A1* | 4/2012 | Park .................. H01L 23/3121 257/737 |
| 2014/0210080 | A1* | 7/2014 | Chang .................. H01L 25/50 257/738 |
| 2016/0351462 | A1 | 12/2016 | Kuan et al. |
| 2017/0207151 | A1* | 7/2017 | Lu .................. H01L 21/4825 |
| 2018/0122784 | A1 | 5/2018 | Bolognia |
| 2018/0130757 | A1* | 5/2018 | Haba .................. H01L 23/3121 |
| 2019/0035772 | A1* | 1/2019 | Huang .................. H01L 25/105 |
| 2020/0176384 | A1 | 6/2020 | Wu et al. |
| 2020/0328091 | A1 | 10/2020 | Kim et al. |
| 2020/0350279 | A1 | 11/2020 | Tsai et al. |

OTHER PUBLICATIONS

PCT/US2021/058397, "PCT Notification of Transmittal of the International Searching Report and the Written Opinion of the International Searching Authority, or the Declaration", mailed Mar. 3, 2022, 6 pages.

Romain Cauchois, Mohamed Saadaoui, Jacques Legeleux, Thierry Malia, Beatrice Dubois-Bonvalot, et al.. Chip integration using inkjet-printed silver conductive tracks reinforced by electroless plating for flexible board packages. MiNaPAD 2012. Micro/Nano-Electronics Packaging & Assembly, Design and Manufacturing Forum, Apr. 2012, Grenoble, France. pp. F01. emse-00691806.

* cited by examiner

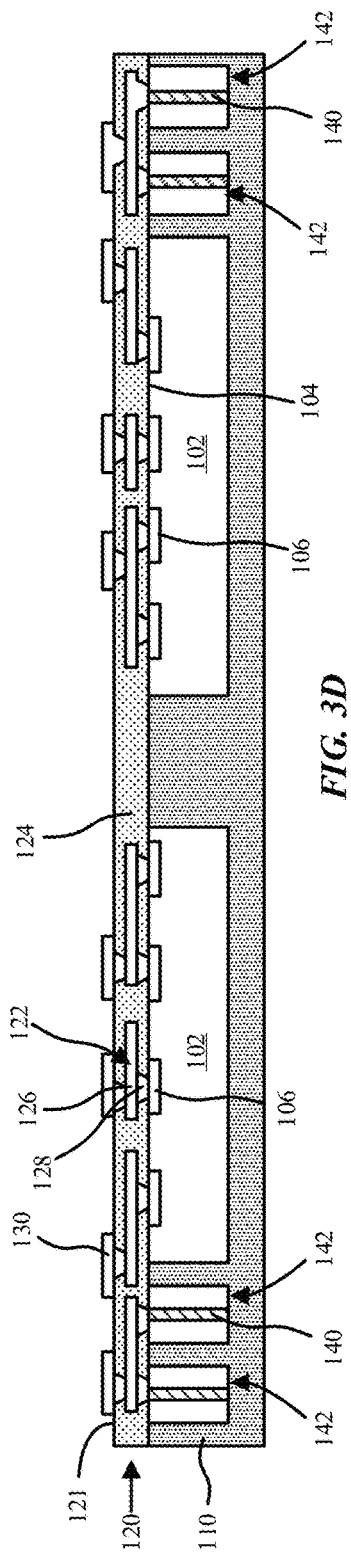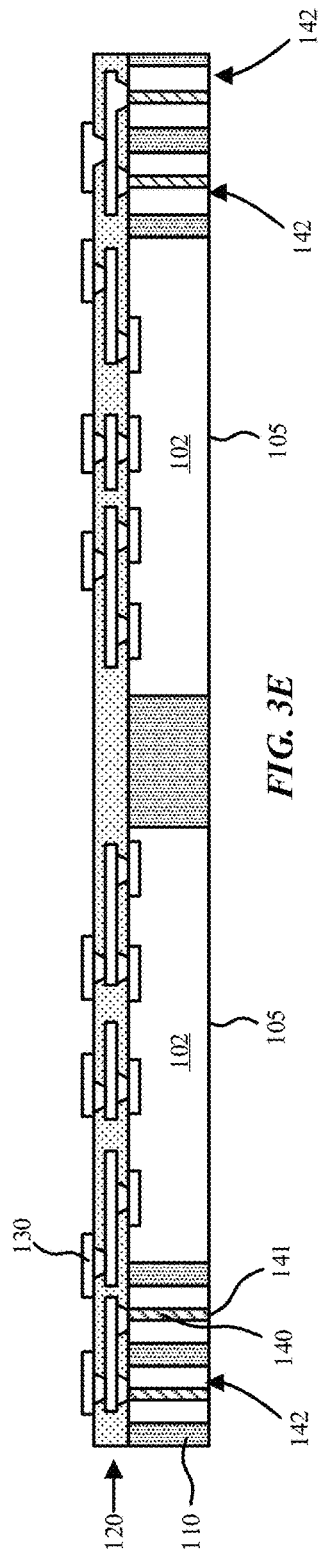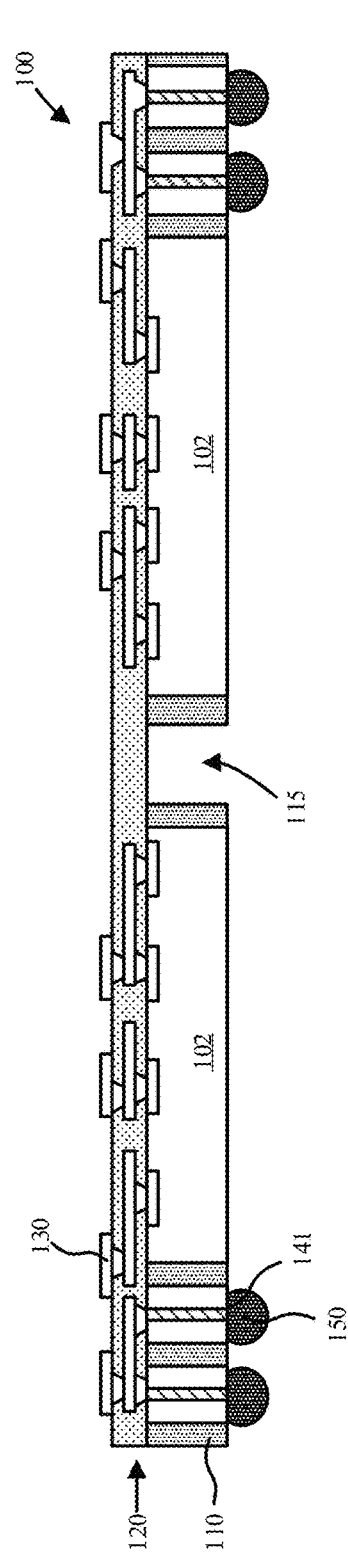

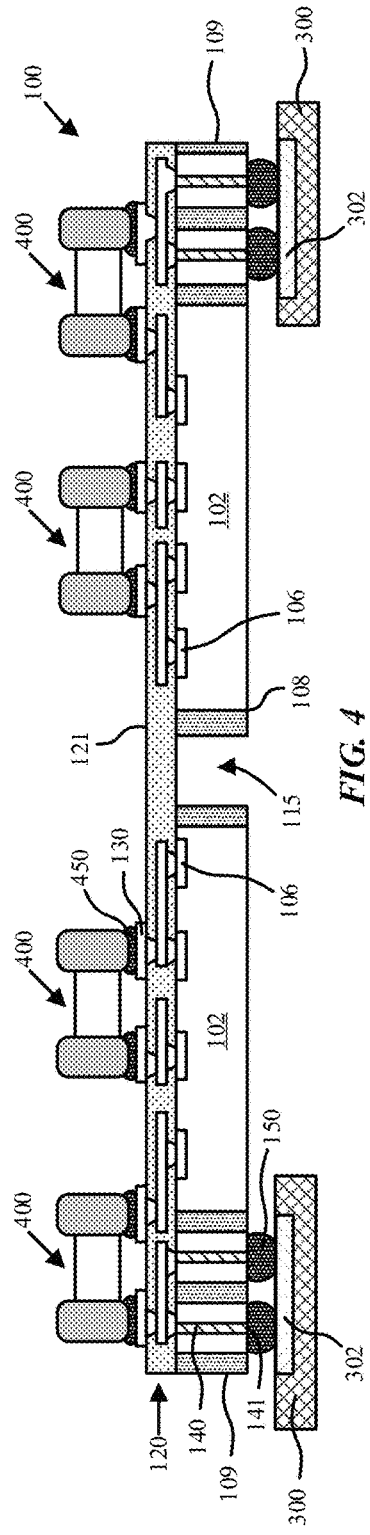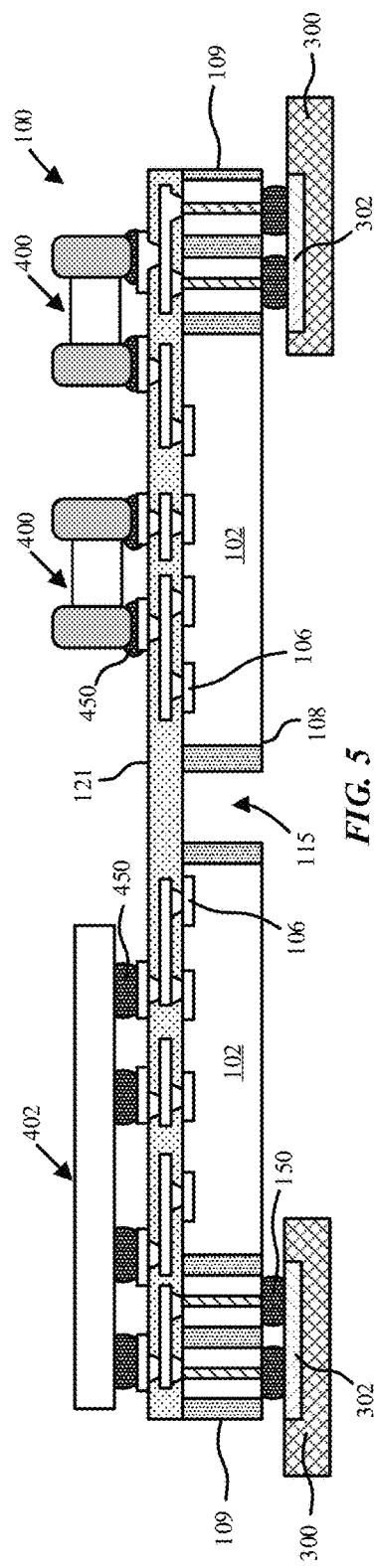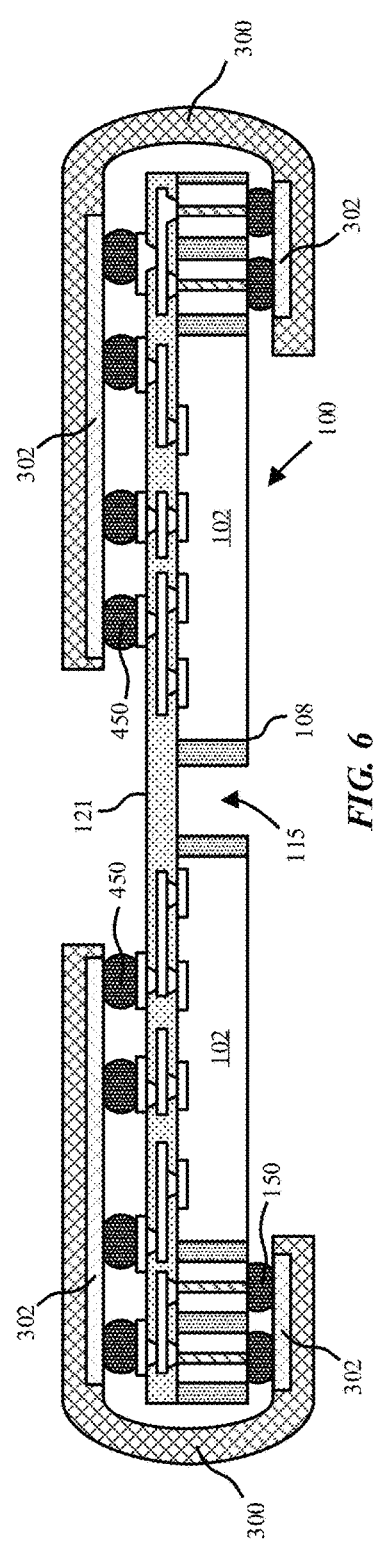

FLEXIBLE PACKAGE ARCHITECTURE CONCEPT IN FANOUT

BACKGROUND

Field

Embodiments described herein relate to electronic packaging, and more particularly to flexible packages.

Background Information

The current market demand for portable and mobile electronic devices such as mobile phones, personal digital assistants (PDAs), digital cameras, portable players, gaming, wearables, and other mobile devices requires the integration of more performance and features into increasingly smaller spaces where available module substrate area may be restricted.

Flexible printed circuit boards (PCB) are becoming more common, where unlike traditional rigid PCBs, the flexible PCBs (flex boards, or flexible printed circuits) can be bent, folded or twisted during use or to meet design objectives. Such flex boards commonly include a flexible substrate (e.g. polymer such as polyimide, polyester, polyethylene nphthalate, etc.) with printed circuit pattern (e.g. metal pattern such as copper) on one or both sides of the flexible substrate. Various chips can be mounted on the printed circuit pattern. Multilayer flex boards can also be formed. Another solution includes rigid-flex PCBs, where a flex connector connects to another board with use of sockets spring pins, etc. Chips may be mounted only on the boards, or also on the flex connector, which can include insulated routing layers, for example, alternating metal and insulator layers.

SUMMARY

Embodiments describe flexible packages, their method of fabrication, and manners for integrating the flexible packages into electronic devices, such as bonding to other flexible routing substrates or non-planar landing areas. In an embodiment, a flexible package includes a first die and a second die encapsulated in a molding compound layer. A compliant redistribution layer (RDL) spans the molding compound layer and both dies, and includes electrical routing formed directly on landing pads of the dies. A notch (recess) is formed in the molding compound layer between the dies to facilitate flexure of the compliant RDL.

The flexible packages can include additional devices, such as dies or components bonded to either the face side of the RDL or back side of the flexible package to from three dimensional (3D) flexible packages with multiple package levels. Furthermore, either the face side or back side of the flexible packages, or both, can be bonded to corresponding landing areas.

BRIEF DESCRIPTION OF THE DRAWINGS

FIGS. 3A-3F are schematic cross-sectional side view illustrations for a method of forming a flexible package in accordance with embodiments.

FIGS. 4-5 are a schematic cross-sectional side view illustrations of 3D flexible packages with the package back sides mounted on multiple landing areas in accordance with an embodiment.

FIG. 6 is a schematic cross-sectional side view illustration of a flexible package with both face and back sides mounted to multiple landing areas in accordance with an embodiment.

DETAILED DESCRIPTION

Figure 1:
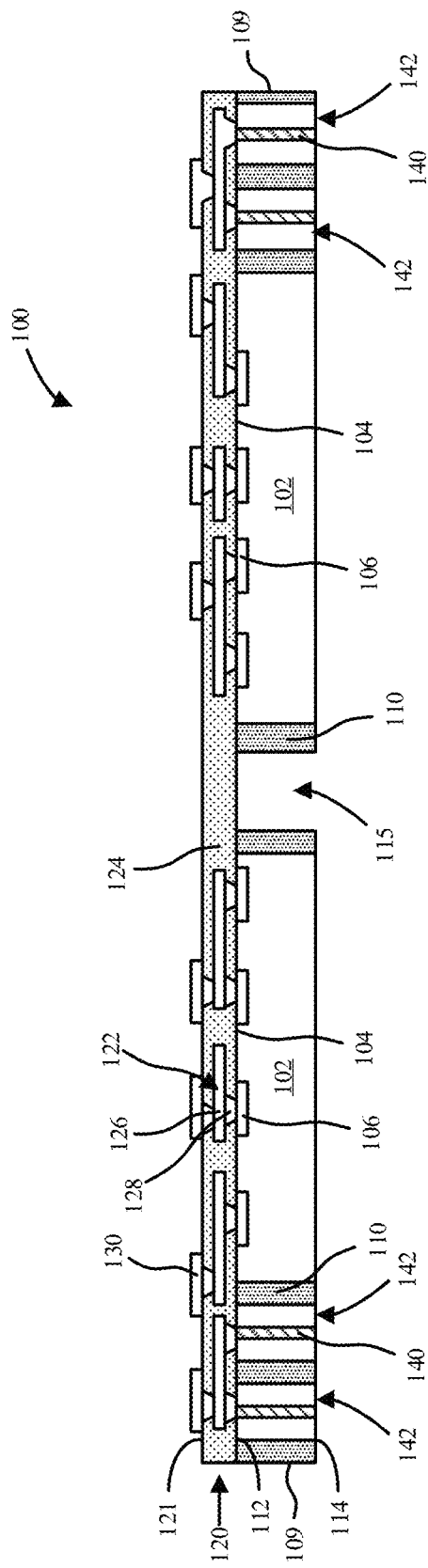
FIG. 1 is a schematic cross-sectional side view illustration of a general building block for a flexible package in accordance with embodiments.

Embodiments describe flexible packages, methods of fabricating flexible packages, and electronic devices with integrated flexible packages. The flexible packages in accordance with embodiments may include a first die and a second die encapsulated in a molding compound layer, and a compliant redistribution layer (RDL) spanning the molding compound layer, the first die, and the second die. Specifically, the compliant RDL may include electrical routing formed directly on first landing pads of the first die and directly on landing pads of the second die. A notch (recess) can be formed within the molding compound layer between the first die and the second die. This may facilitate use of the compliant RDL for providing the package flexibility.

In one aspect, embodiments describe flexible package structures in which a compliant RDL is used to provide package flexibility. Thus, unlike traditional flex boards or flexible printed circuits, embodiments do not rely upon a flexible substrate.

In another aspect, embodiments can leverage traditional embedded wafer level processing (eWLP) techniques for manufacturing, thus integrating simple and reliable process flows to create thin and flexible package profiles. For example, the primary package thickness can be primarily due to a thinned die thickness, with minimal contribution of the compliant RDL. An exemplary manufacturing sequence can include placing a first die and a second die face down on a carrier substrate, encapsulating the first die and the second die in a molding compound layer, removing the carrier substrate and optionally thinning the molded surface, forming a compliant RDL on the first die, the second die, and the molding compound layer, and forming a notch in the molding compound layer between the first die and the second die.

The general building block of the flexible package structure can be subjected to additional packaging sequences depending upon application. For example, the additional packaging can be performed to form multiple package levels for 3D system in package (SiP) configurations, and the integration of additional components, including dies and passives, etc. Additionally, double side RDLs may be included. The flexible packages in accordance with embodiments can be mounted in various electronic structures, including onto traditional flex boards, onto multiple routing substrates, or other structures and enclosures.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of a general building block for a flexible package 100 in accordance with embodiments. As shown, the package 100 includes a plurality of dies 102 encapsulated in a molding compound layer 110, and a compliant redistribution layer (RDL) 120 spanning a front side 112 of the molding compound layer 110 and front faces 104 of the dies 102 including landing pads 106. For the sake of clarity and conciseness, the following description is made with regard to the illustrated embodiment including a first die and a second die, though it is understood embodiments are not so limited. In accordance with embodiments, the compliant RDL 120 includes electrical routing 122 formed directly on the landing pads 106 of the dies 102. For example, the compliant RDL 120 may include one or more dielectric layers 124, and one or more conductive traces 126 and vias 128 forming the electrical routing 122. A face side 121 of the compliant RDL 120 may additionally include terminal contact pads 130. For example, these may be underbump metallurgy (UBM) pads for mounting the flexible package 100 onto the landing area of another component. The face side 121 of the compliant RDL 120 may also correspond to the face side 121 of the flexible package 100.

One or more notches 115 can be formed within the molding compound layer 110 between the any of the dies 102 or multiple die sets. In the particular embodiment illustrated the notch 115 is formed completely through the molding compound layer 110 such that there is no thickness of the molding compound layer remaining beneath the notch 115, though this is not required and the notch may extend partially though the molding compound layer 110 thickness such that a thickness of the molding compound layer underneath the notch is less than a first thickness of the first die and a second thickness of the second die. In accordance with many embodiments, the notches 115 are not filled with a rigid material, may remain unfilled (e.g. air gap), or if necessary, filled with a compliant material such as a gel.

The RDL 120 may fanout the electrical routing 122 and terminal contact pads 130 to accommodate more bending area underneath the notch 115. Thus, the terminal contact pads 130 may be fanned out, closer to the package side edges 109 than the die 102 landing pads 106, particularly the interior-most contact pads 130 to accommodate more bending area.

In accordance with embodiments one or more vertical interconnects 140 extend through the molding compound layer 110. For example, the vertical interconnects 140 can extend from the front side 112 of the molding compound layer 110 to the back side 114 of the molding compound layer. Electrical routing 122 may be formed directly on the vertical interconnects 140 exposed on the front side of the molding compound. The vertical interconnects 140 may be formed of a variety of features to include vertical electric connection, including pillars (e.g. copper pillars) or as part of a discrete component 142 such as a PCB bar, molded interconnect substrate (MIS) interposer, or other component including some combination of vias, terminal contact pads, etc.

Figure 2:
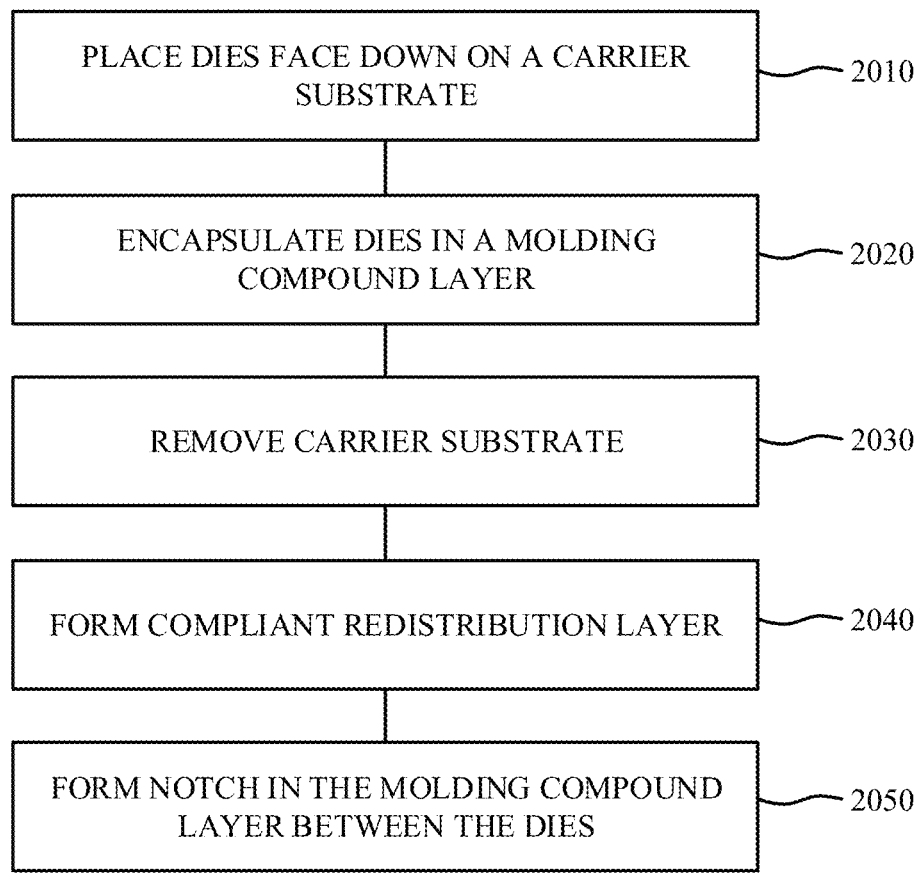
FIG. 2 is a process flow for a method of forming a flexible package in accordance with embodiments.

FIG. 2 is a process flow for a method of forming a flexible package in accordance with embodiments. FIGS. 3A-3F are schematic cross-sectional side view illustrations for a method of forming a flexible package in accordance with embodiments. In interest of clarity and conciseness the processing sequences of FIGS. 2 and 3A-3F are described concurrently.

Figure 3A:
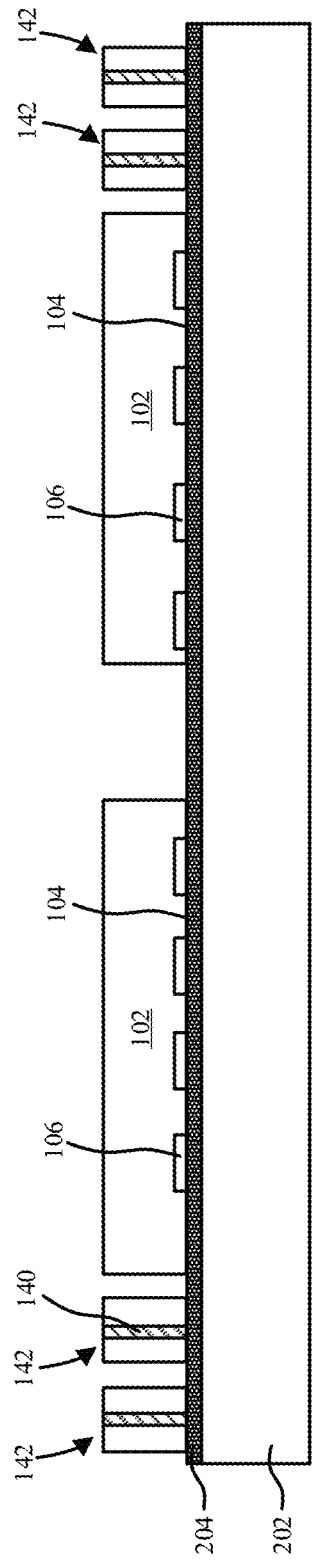

At operation 2010 dies 102 are placed face 104 down on a carrier substrate 202 as shown in FIG. 3A. Carrier substrate 202 may be any rigid substrate to support the following processing sequences, including wafer (e.g. silicon wafer), glass, metal, etc. In an embodiment, the dies 102 are placed onto a double side tape layer 204 (adhesive) on the carrier substrate 202. One or more vertical interconnects 140 can also be located adjacent the dies 102. For example, these can be pre-formed pillars. Alternatively, the vertical interconnects 140 can be included in other discrete components 142 also placed onto the double side tape layer 204. It is appreciated, this sequence can be at the wafer or panel scale, for the formation of an array of flexible packages.

Figure 3B:
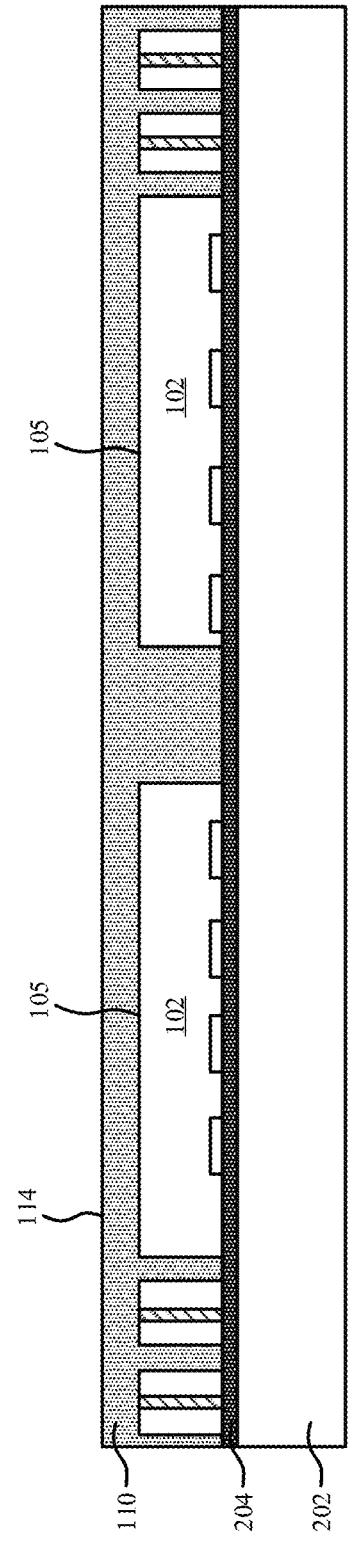
Figure 3C:
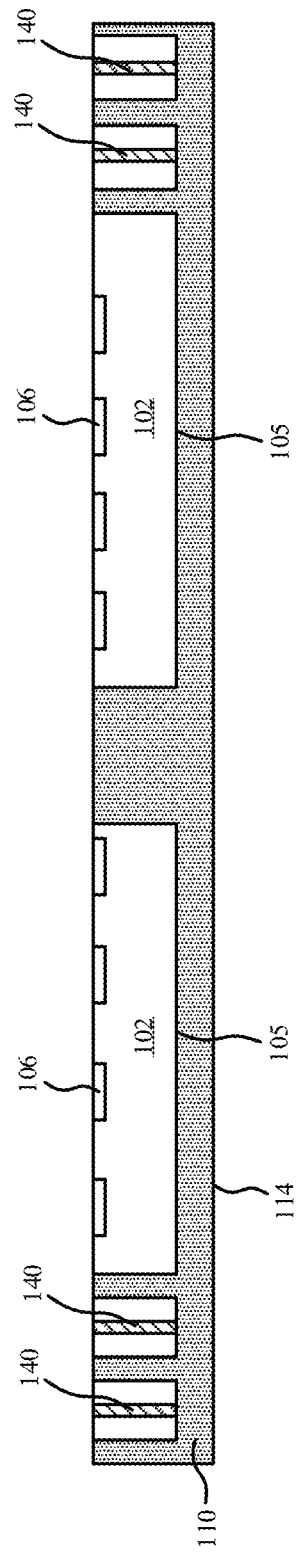

Referring now to FIG. 3B the dies 102 and optional vertical interconnects 140 (discrete components 142) are encapsulated in a molding compound layer 110 which may optionally cover the back sides 105 of the dies 102 and vertical interconnects 140. The carrier substrate 202 and adhesive layer, such as double side tape layer 204 can then be removed at operation 2030 resulting in the reconstituted structure illustrated in FIG. 3C, which can be at the wafer or panel scale. This may result in exposing the landing pads 106 of dies 102 as well as the vertical interconnects 140. Overmolding the back sides 105 of the dies 102 at operation 2020 may provide structural stability for processing the reconstituted structure after removal of the carrier substrate 202.

Referring now to FIG. 3D the compliant RDL 120 is then formed at operation 2040. As shown, the compliant RDL 120 can be formed on, and spans over the dies 102, molding compound layer 110, as well as vertical interconnects 140 (or the discrete components 142). The compliant RDL 120 may be formed by a layer-by-layer process and may be formed using thin film technology. Conductive traces 126 and vias 128 may be created by first depositing a seed layer, followed by growing a metal (e.g., copper) pattern. Alternatively, conductive traces 126 and vias 128 may be formed by deposition (e.g., sputtering) and etching. In an embodiment, the compliant RDL 120 includes a conductive trace 126 and connected vias 128 with a single bulk metal layer. The material of conductive traces 126 and vias 128 can include, but is not limited to, a metallic material such as copper, titanium, nickel, gold, and combinations or alloys thereof. The metal pattern is then embedded in a dielectric layer 124, which is optionally patterned. The dielectric layer 124 may be any suitable flexible material such as an oxide, or polymer (e.g., polyimide).

In accordance with embodiments, a thin film compliant RDL 120 may have a thickness that is less than a conventional organic or laminate substrate, or flex connector. For example, a conventional six metal layer organic or laminate substrate may have a thickness of 200 µm-500 µm. Thickness of a compliant RDL 120 in accordance with embodiments may be determined by the number of conductive traces 126 and dielectric layers 124 as well as the manner for formation. In accordance with embodiments, conductive traces 126 may have a thickness 10 µm or less, such as approximately 3-10 µm, and dielectric layers have a thickness of 5 µm or less, such as 2-5 µm. The compliant RDLs in accordance with embodiments may additionally allow for narrower line spacing width (fine pitch) and thinner lines compared to conventional organic or laminate substrates, or flex connectors. In an embodiment, the compliant RDL 120 has total a maximum thickness of less than 70 µm, or more specifically approximately 50 µm or less, such as approximately 30 µm. In an exemplary implementation, a bi-layer for a conductive trace 126 and corresponding dielectric layer 124 can be approximately 5 µm for a compliant RDL 120. Presuming a variation of up to an additional 30 µm for layer thickness variation, or additional passivation layers, a compliant RDL 120 may be less than 50 µm for a 4 metal layer design, or less than 70 µm for an 8 metal layer design.

Referring now to FIG. 3E, the reconstituted structure may be thinned, for example by polishing the molding compound layer 110 to expose the back sides 105 of the dies 102, or even reduce the thickness of the dies 102 as well as expose back sides 141 of the vertical interconnects 140. In an embodiment the thinned dies have a thickness of less than 300 µm, such as approximately 250 µm. One or more notches 115 may then be formed in the molding compound layer 110 between the dies 102 at operation 2050, as shown in FIG. 3F. Additionally, conductive bumps 150 (e.g. solder bumps) can be formed on the back sides 141 of the vertical interconnects 140 (or discrete components 142) or the terminal contact pads 130 on the face side 121 of the compliant RDL 120/flexible package 100. Conductive bumps 150 may optionally be formed before or after notches 115.

The thin flexible package 100 structures in accordance with embodiments can be further processed to include additional RDLs, or package levels by bonding additional devices, such as additional chips or passive components, etc, and may be integrated into various electronic device configurations. In accordance with embodiments, the flexible packages can be mounted onto landing areas such that the compliant RDL 120 underneath the one or more notches 115 is flexible. Thus, the landing areas attached to the flexible package 100 on laterally opposite sides of the notch(es) 115, whether on the back side or face side of the flexible package 100, can be secured in non-coplanar positions, or be movable, or foldable so that the flexible package 100 flexes with the substrate(s) to which it is attached. In accordance with many embodiments, the notches 115 are not filled with a rigid material, may remain unfilled (e.g. air gap), or if necessary, filled with a compliant material such as a gel. In an embodiment, the RDL 120 does not include any terminal contact pads directly underneath the notches 115. Various electronic device configurations are illustrated in FIGS. 4-12.

FIG. 4 is a schematic cross-sectional side view illustrations of a 3D flexible package 100 with the package back side 108 mounted on multiple landing areas 302 in accordance with an embodiment. In the particular embodiment illustrated, the landing areas 302 may be on opposite routing substrates 300, such as a rigid PCB, flexible PCB (flex board), etc. Landing areas 302 may also be directly underneath, or at least partially overlap, the dies 102 and vertical interconnects 140, though some offset may be expected due to fanout or fan in routing of the RDL 120. In particular, the RDL 120 may fanout the electrical routing 122 and terminal contact pads 130 to accommodate more bending area underneath the notch 115. Thus, the terminal contact pads 130 may be fanned out, closer to the package side edges 109 than the die 102 landing pads 106, particularly the interior-most contact pads 130 to accommodate more bending area. Also shown in FIG. 4 is a variation of the flexible package 100 where additional components are bonded to the terminal contact pads 130 on the face side 121 of the compliant RDL 120 to form a 3D flexible package. Bonding may be achieved using conductive material 450 such as conductive paste, conductive bumps (e.g. solder bumps), microbumps, etc. FIG. 5 is similar to the illustrated embodiment of FIG. 4, with the only difference being that 3D flexible package structures can additionally, or alternatively include additional die(s) 402 bonded to the terminal contact pads 130 on the face side 121 of the compliant RDL 120 in place of, or in addition to components 400.

In both embodiments illustrated in FIGS. 4-5 the landing areas 302 are illustrated as being co-planar, however, this is not required. As previously described, the compliant RDL 120 can flex, in particular in the region underneath the notch 115. Bending can be out of plane, as well as twisting. In accordance with embodiments, the landing areas 302 may be fixed in non-planar locations, or the routing substrates 300 may be flexible so that the landing areas 302 can be moved to non-planar positions, while the flexible package 100 flexes with motion of the routing substrate(s) 300.

Additionally, in both embodiments illustrated in FIGS. 4-5 a device (e.g. die 402, component 400) is not bonded to the face side 121 of the compliant RDL 120 that spans across the notch 115. In this manner, a rigid structure does not interfere with bending of the compliant RDL 120.

Referring now to FIG. 6 a schematic cross-sectional side view illustration of a flexible package with both face and back sides mounted to multiple landing areas in accordance with an embodiment. In the exemplary embodiment shown, flexible routing substrates 300, such as flex boards, may be connected to both terminal contact pads 130 and back sides 141 of the vertical interconnects 140, and wrap around edges of the flexible package 100. It is understood FIG. 6 is merely illustrative. It is not required for the routing substrates 300 to be mounted to both sides of the flexible package 100, and thus FIG. 6 is to be understood as showing either or both sides of the flexible package 100 can be mounted to a different landing area 302 on the same or different routing substrates 300. Further, similar to FIGS. 4-5, the landing areas 302 may be fixed in non-planar locations, or the routing substrates 300 may be flexible so that the landing areas 302 can be moved to non-planar positions, while the flexible package 100 flexes with motion of the routing substrate(s) 300.

Figure 7:
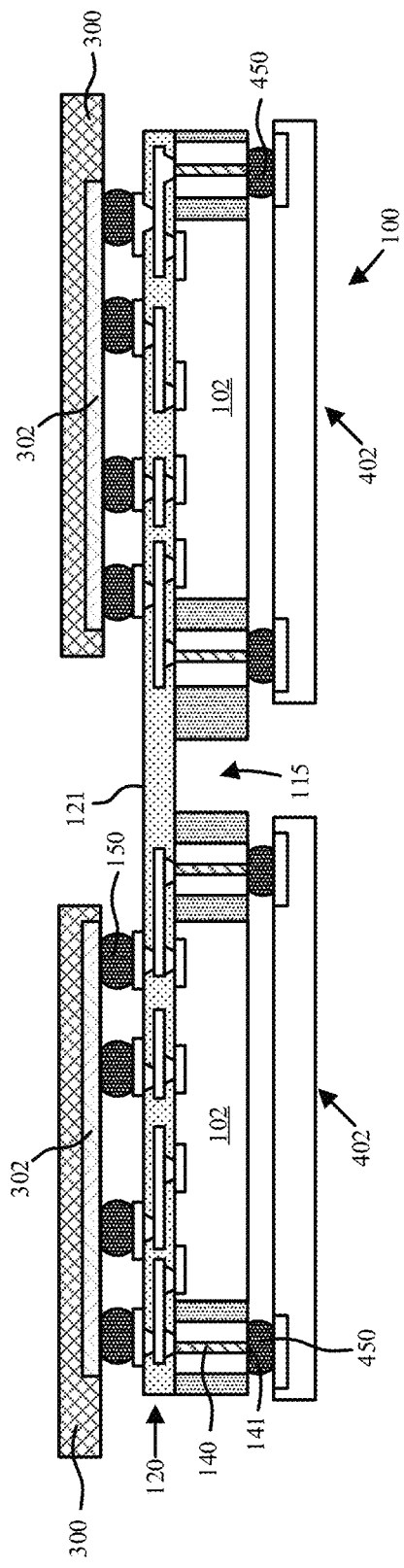
FIG. 7 is a schematic cross-sectional side view illustration of a 3D flexible package with the package face side mounted on multiple landing areas in accordance with an embodiment.

Referring now to FIG. 7 another embodiment of a 3D flexible package 100 is illustrated in which, rather than mounting the package back side 108 to routing substrate(s) 300, instead the package face side 121 is mounted on multiple landing areas 302 in accordance with an embodiment. Additionally, a 3D flexible package 100 can be achieved by bonding one or more dies 402 (or components) to the back sides 141 of the vertical interconnects 140. Similar to the previously described electronic device configurations, the landing areas 302 may be fixed in non-planar locations, or the routing substrates 300 may be flexible so that the landing areas 302 can be moved to non-planar positions, while the flexible package 100 flexes with motion of the routing substrate(s) 300.

Figure 8:
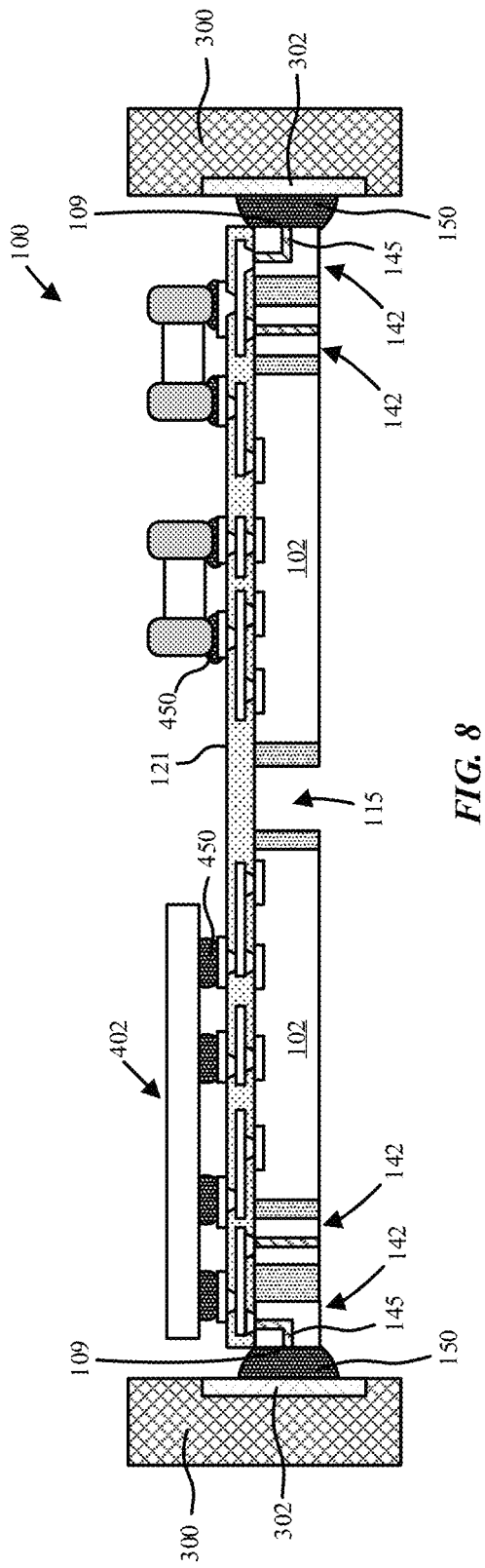
FIG. 8 is a schematic cross-sectional side view illustration of a 3D flexible package with the package with side edges mounted to multiple landing areas in accordance with an embodiment.

Up until this point embodiments have been described in which the face sides or back sides of the flexible packages 100 are bonded to multiple landing areas 302. FIG. 8 is a schematic cross-sectional side view illustration of a 3D flexible package 100 with the package side edges 109 mounted to multiple landing areas 302 in accordance with an embodiment. In particular, the discrete components 142 previously described as including vertical interconnects 140 can include lateral interconnects 145 for bonding the package side edges 109 to landing areas 302, which may be included in routing substrates 300. In such an embodiment, the landing areas 302 may be fixed in non-parallel locations, or the routing substrates 300 may be flexible so that the landing areas 302 can be moved to non-parallel positions, while the flexible package 100 flexes with motion of the routing substrate(s) 300.

Up until this point embodiments have been described and illustrated in which the landing areas 302 are formed on physically separate routing substrates 300. However, this is not required, and the flexible packages 100 described herein can also be mounted on the same side of a rigid or flexible routing substrate 300. In such as configuration the flexible packages 100 can flex with the flexible routing substrates 300 to which they are bonded. Additionally, the face sides or back sides of the flexible packages 100 can be bonded to the routing substrates 300, and the flexible packages 100 can also be 3D flexible packages.

Figure 9A:
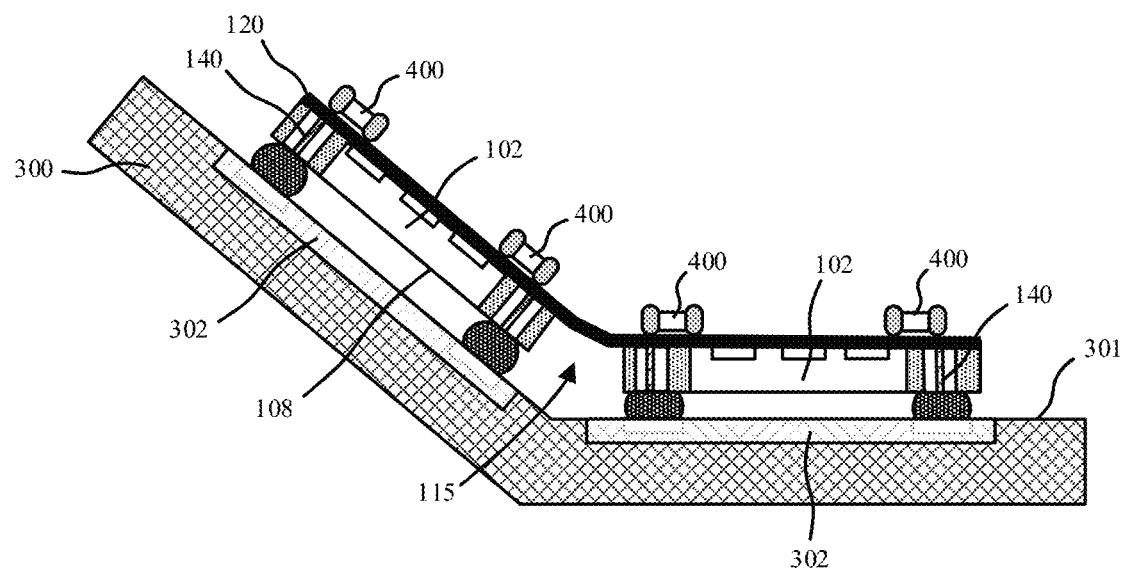
FIG. 9A is a schematic cross-sectional side view illustration of a 3D flexible package that is back side mounted to multiple landing areas in accordance with an embodiment.

FIG. 9A is a schematic cross-sectional side view illustration of a 3D flexible package 100 back side 108 mounted to multiple landing areas 302 in accordance with an embodiment. In particular, the 3D flexible package 100 can be similar to the configurations of FIGS. 4-5, with the difference being the 3D flexible package 100 is mounted to a single substrate, and the landing areas 302 are located on a same first side 301 of the routing substrate 300.

Figure 9B:
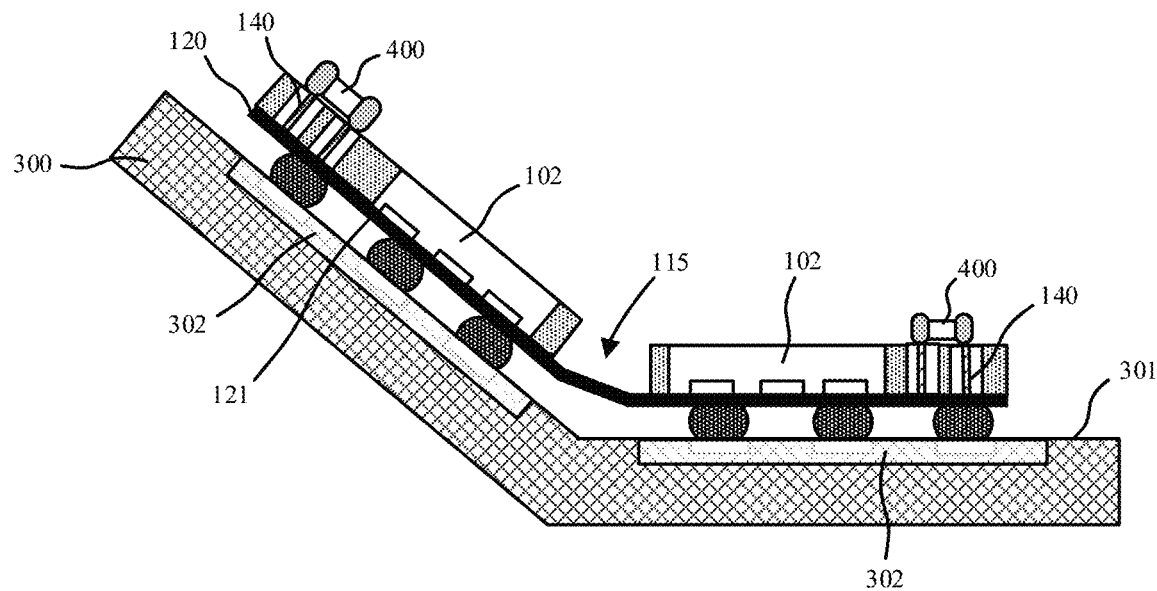
FIG. 9B is a schematic cross-sectional side view illustration of a 3D flexible package that is face side mounted to multiple landing areas in accordance with an embodiment.

FIG. 9B is a schematic cross-sectional side view illustration of a 3D flexible package 100 that is face side 121 mounted to multiple landing areas 302 in accordance with an embodiment. In particular, the 3D flexible package 100 can be similar to the configurations of FIG. 7, with the difference being the 3D flexible package 100 is mounted to a single substrate, and the landing areas 302 are located on a same first side 301 of the routing substrate 300.

In both embodiments illustrated in FIGS. 9A-9B the routing substrate first side 301 is folded, or is foldable inward such that the first landing area 302 and the second landing area 302 on opposite sides of the fold are at an angle of less than 180 degrees. However, alternative arrangements are envisioned, including where the routing substrate is folded, or is foldable outward such that the first landing area 302 and the second landing area 302 on opposite sides of the fold are at an angle of greater than 180 degrees.

Figure 10:
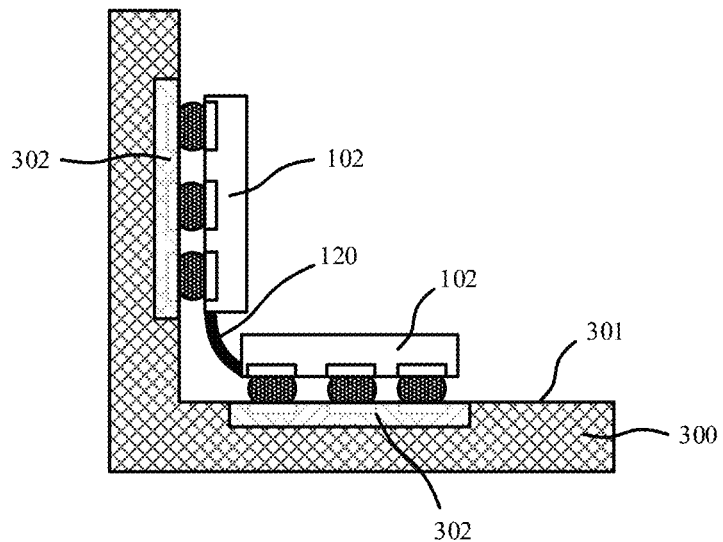
FIG. 10 is a schematic side view illustration of a flexible package mounted to an L-shaped enclosure in accordance with an embodiment.
Figure 11:
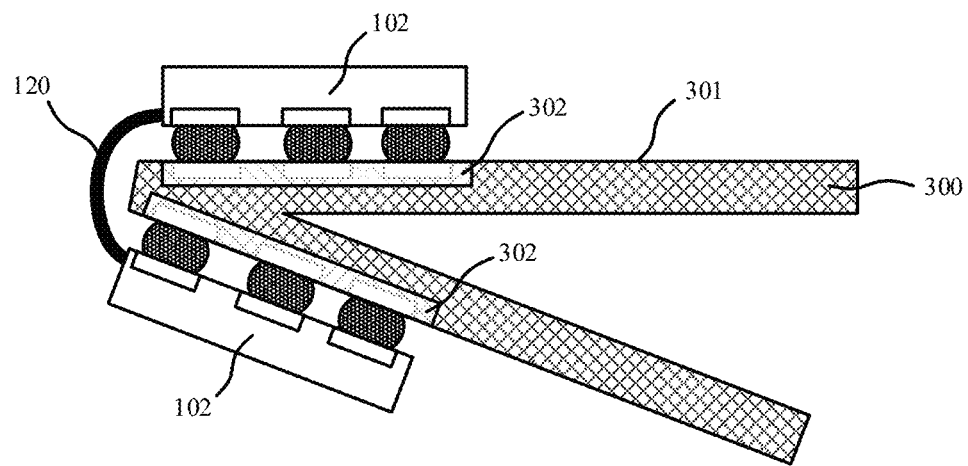
FIG. 11 is a schematic side view illustration of a flexible package mounted around an obtuse enclosure in accordance with an embodiment.
Figure 12:
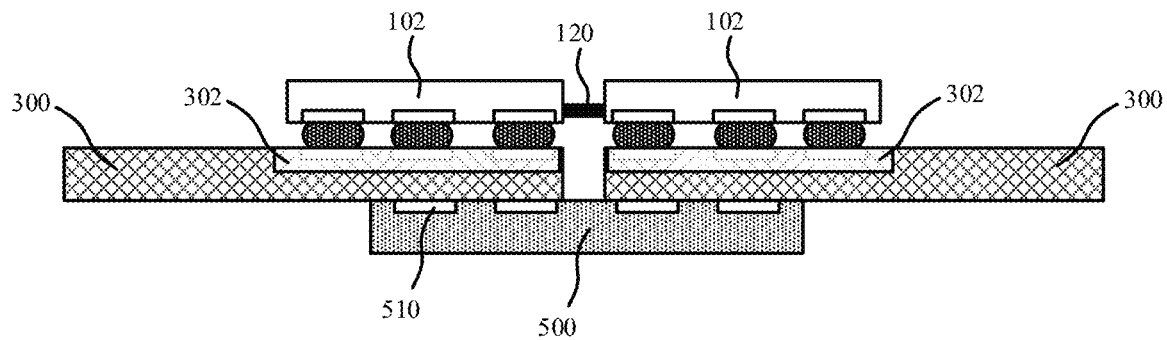
FIG. 12 is a schematic side view illustration of a flexible package mounted to two routing substrates with an attached back side enclosure in accordance with an embodiment.

Referring now to FIGS. 10-12 additional electronic device configurations are illustrated. It is be appreciated that unlike FIGS. 9A-9B, the illustrations of FIGS. 10-12 are simplified to correspond to either face side 121 mounted or back side 108 mounted flexible packages 100. Thus, the illustrations of FIGS. 10-12 are less detailed than the illustrations of FIGS. 9A-9B in this respect.

Referring now to FIG. 10 a schematic side view illustration is provided of a flexible package 100 mounted to an L-shaped enclosure in accordance with an embodiment. The L-shaped enclosure may be one, or multiple routing substrates 300. Additionally, the L-shaped enclosure may be fixed in place or movable.

FIG. 11 is a schematic side view illustration of a flexible package 100 mounted around an obtuse enclosure in accordance with an embodiment. The obtuse enclosure may be one, or multiple routing substrates 300. In the embodiment illustrated, the routing substrate 300 is folded, or is foldable outward such that the first landing area 302 and the second landing area 302 on opposite sides of the fold are at an angle of greater than 180 degrees. Additionally, the landing areas 302 may be on the same first side 301 of the routing substrate.

Referring now to FIG. 12 a schematic side view illustration is provided of yet another design for an electronic device in which a flexible package 100 is mounted to two routing substrates 300 with an attached back side enclosure 500 in accordance with an embodiment. For example, the back side enclosure 500 can be a mechanical chiplet (e.g. without functionality, silicon, plastic, metal), or a rigid routing substrate including contact pads 510 for electrical connection between the two routing substrates 300. In this manner, the configuration can still be flexible, yet include an amount of restraining structure to limit the amount of flexure.

In utilizing the various aspects of the embodiments, it would become apparent to one skilled in the art that combinations or variations of the above embodiments are possible for forming and integrating flexible packages into electronic devices. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic device comprising:
a first landing area and a second landing area; and
a flexible package mounted on the first landing area and the second landing area, the flexible package comprising:
a first die with a first face and a first back side opposite the first face, the first face including first landing pads;
a second die with a second face and a second back side opposite the second face, the second face including second landing pads;
wherein the first die and the second die encapsulated in a molding compound layer;

a compliant redistribution layer (RDL) spanning the molding compound layer, the first die, and the second die, wherein the compliant RDL includes electrical routing formed directly on the first landing pads of the first die and directly on the second landing pads of the second die;

a notch within the molding compound layer directly laterally between the first die and the second die and defining a region of the compliant RDL directly underneath the notch;

wherein the compliant RDL is twisted or bent out of plane in the region underneath the notch such that the first face and the second face are out of plane with one another;

a first vertical interconnect extending through the molding compound layer, and a second vertical interconnect extending through the molding compound layer, the first vertical interconnect including a first back side and the second vertical interconnect including a second back side;

wherein the notch separates the molding compound layer into a first molding compound region that encapsulates the first die and the first vertical interconnect and a second molding compound region that encapsulates the second die and the second vertical interconnect;

wherein the first back side of the first die, the first back side of the first vertical interconnect and a first back side of the first molding compound region form a first planarized surface;

wherein the second back side of the second die, the second back side of the second vertical interconnect and a second back side of the second molding compound region form a second planarized surface; and wherein the first vertical interconnect is bonded to the first landing area with a first conductive bump, and the second vertical interconnect is bonded to the second landing area with a second conductive bump.

2. The electronic device of claim 1, wherein the notch is not filled with a rigid material.

3. The electronic device of claim 2, wherein the compliant RDL has a maximum thickness of 50 μm or less.

4. The electronic device of claim 3, wherein the RDL includes a plurality of terminal contact pads, and does not include a terminal contact pad located directly underneath the notch.

5. The electronic device of claim 2, wherein the first landing area and the second landing area are located on a same side of a routing substrate.

6. The electronic device of claim 5, wherein the routing substrate first side is folded or is foldable inward such that the first landing area and the second landing area are at an angle of less than 180 degrees.

7. The electronic device of claim 5, wherein the routing substrate first side is folded or foldable outward such that the first landing area and the second landing area are at an angle of greater than 180 degrees.

8. The electronic device of claim 2, wherein the first landing area is located in a first routing substrate, and the second landing area is located in a second routing substrate physically separate from the first routing substrate.

9. The electronic device of claim 1, further comprising a first device bonded to a face side of the compliant RDL opposite the first die, and a second device bonded to a face side of the compliant RDL opposite the second die.

10. A flexible package comprising:
a first die with a first face and a first back side opposite the first face, the first face including first landing pads;
a second die with a second face and a second back side opposite the second face, the second face including second landing pads;
wherein the first die and the second die encapsulated in a molding compound layer;
a plurality of vertical interconnects extending through the molding compound layer;
a compliant redistribution layer (RDL) spanning the plurality of vertical interconnects, the molding compound layer, the first die and the second die, wherein the compliant RDL includes electrical routing formed directly on the first landing pads of the first die and directly on the second landing pads of the second die;
a plurality of conductive bumps connected to the plurality of vertical interconnects; and
a notch within the molding compound layer directly laterally between the first die and the second die and defining a region of the compliant RDL directly underneath the notch;
wherein the notch separates the molding compound layer into a first molding compound region that encapsulates the first die and a second molding compound region that encapsulates the second die;
wherein the first back side of the first die and a first back side of the first molding compound region form a first planarized surface;
wherein the second back side of the second die and a second back side of the second molding compound region form a second planarized surface; and
wherein the notch is not filled with a rigid material, and the compliant RDL is bent out of plane in the region underneath the notch such that the first face and the second face are out of plane with one another.

11. The flexible package of claim 10, wherein the compliant RDL has a maximum thickness of 50 μm or less.

12. The flexible package of claim 10, wherein the compliant RDL includes a plurality of terminal contact pads on a face side of the compliant RDL, and the terminal contact pads are fanned out closer to side edges of the flexible package than the first landing pads and the second landing pads.

\* \* \* \* \*